(12) United States Patent
Wildeson et al.

(10) Patent No.: US 10,749,070 B2
(45) Date of Patent: Aug. 18, 2020

(54) METHOD OF FORMING A P-TYPE LAYER FOR A LIGHT EMITTING DEVICE

(71) Applicant: Lumileds LLC, San Jose, CA (US)

(72) Inventors: Isaac Wildeson, San Jose, CA (US); Erik Charles Nelson, San Jose, CA (US); Parijat Deb, San Jose, CA (US)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 15/592,658

(22) Filed: May 11, 2017

(65) Prior Publication Data

US 2017/0338373 A1  Nov. 23, 2017

Related U.S. Application Data

(60) Provisional application No. 62/339,448, filed on May 20, 2016.

(30) Foreign Application Priority Data

Jul. 15, 2016  (EP) .................................... 16179661

(51) Int. Cl.
*H01L 33/00* (2010.01)
*H01L 33/02* (2010.01)
(Continued)

(52) U.S. Cl.
CPC .......... *H01L 33/0075* (2013.01); *H01L 27/15* (2013.01); *H01L 33/0008* (2013.01);
(Continued)

(58) Field of Classification Search
CPC ... H01L 33/0062–0075; H01L 33/0095; H01L 33/0075; H01L 33/0008;
(Continued)

(56) References Cited

U.S. PATENT DOCUMENTS 6,048,748 A * 4/2000 Khare ................. H01L 33/0095
438/39
6,537,838 B2  3/2003 Stockman
(Continued)

FOREIGN PATENT DOCUMENTS

JP   S55118629 A    9/1980
JP   2003068745 A   3/2003
(Continued)

OTHER PUBLICATIONS

European Search Report dated Dec. 16, 2016 from European Application No. 16179661.0, filed Jul. 15, 2016, 7 pages.
(Continued)

*Primary Examiner* — Joseph C. Nicely
(74) *Attorney, Agent, or Firm* — Servilla Whitney LLC (57) ABSTRACT

In a method according to embodiments of the invention, a semiconductor structure including a III-nitride light emitting layer disposed between a p-type region and an n-type region is grown. The p-type region is buried within the semiconductor structure. A trench is formed in the semiconductor structure. The trench exposes the p-type region. After forming the trench, the semiconductor structure is annealed.

22 Claims, 3 Drawing Sheets

(51) Int. Cl.
   *H01L 33/22* (2010.01)
   *H01L 33/30* (2010.01)
   *H01L 27/15* (2006.01)
   *H01L 33/04* (2010.01)
   *H01L 33/24* (2010.01)

(52) U.S. Cl.
   CPC ...... *H01L 33/0025* (2013.01); *H01L 33/0062* (2013.01); *H01L 33/0095* (2013.01); *H01L 33/025* (2013.01); *H01L 33/04* (2013.01); *H01L 33/22* (2013.01); *H01L 33/24* (2013.01); *H01L 33/30* (2013.01)

(58) Field of Classification Search
   CPC ..... H01L 33/0025; H01L 33/04; H01L 33/30; H01L 33/025; H01L 33/22; H01L 33/24; H01L 27/15
   See application file for complete search history.

(56) References Cited

U.S. PATENT DOCUMENTS

| | | | |
|---|---|---|---|
| 7,244,957 B2 | 7/2007 | Nakajo et al. | |
| 8,039,352 B2 | 10/2011 | Mishra et al. | |
| 2001/0030329 A1* | 10/2001 | Ueta | B82Y 20/00 257/103 |
| 2002/0187568 A1* | 12/2002 | Stockman | H01L 21/3245 438/22 |
| 2004/0041220 A1* | 3/2004 | Kwak | H01L 33/508 257/432 |
| 2007/0125995 A1 | 6/2007 | Weisbuch et al. | |
| 2010/0029035 A1* | 2/2010 | Chin | H01L 31/022425 438/72 |
| 2010/0047947 A1* | 2/2010 | Yashima | H01S 5/223 438/40 |
| 2010/0078688 A1 | 4/2010 | Otake et al. | |
| 2011/0278641 A1* | 11/2011 | Grolier | H01L 33/0095 257/102 |
| 2012/0273755 A1* | 11/2012 | Wei | B82Y 20/00 257/13 |
| 2012/0276666 A1* | 11/2012 | Wei | H01L 21/02521 438/22 |
| 2013/0069079 A1* | 3/2013 | Kim | C30B 25/183 257/76 |
| 2014/0166975 A1* | 6/2014 | Ito | H01L 33/22 257/13 |
| 2014/0175474 A1* | 6/2014 | Han | H01L 33/007 257/94 |
| 2014/0225838 A1* | 8/2014 | Gupta | G06F 3/0412 345/173 |
| 2014/0319456 A1* | 10/2014 | Ikeda | H01L 31/00 257/13 |
| 2015/0024524 A1* | 1/2015 | Yao | H01L 27/156 438/26 |
| 2015/0115290 A1* | 4/2015 | Guenard | H01L 27/142 257/79 |
| 2016/0149074 A1* | 5/2016 | Atanackovic | H01L 33/007 257/13 |
| 2016/0163920 A1* | 6/2016 | Atanackovic | H01L 33/325 257/13 |
| 2018/0091723 A1* | 3/2018 | Funaki | H04N 5/379 |
| 2019/0189848 A1* | 6/2019 | Tak | H01L 33/32 |

FOREIGN PATENT DOCUMENTS

| | | |
|---|---|---|
| JP | 2010-062381 A2 | 3/2010 |
| JP | 2014154808 A | 8/2014 |
| JP | 2015162631 A | 9/2015 |

OTHER PUBLICATIONS

Matioli et al., "Growth of Embedded Photonic Crystals for GaN-Based Optoelectronic Devices", Journal of Applied Physics, American Institute of Physics, vol. 106, No. 2, Jul. 24, 2009, p. 24309.
International Search Report PCT/US2017/032234 dated Jul. 31, 2017.

* cited by examiner

METHOD OF FORMING A P-TYPE LAYER FOR A LIGHT EMITTING DEVICE

CROSS-REFERENCE TO RELATED APPLICATIONS

The present application claims priority to U.S. Provisional Patent Application No. 62/339,448, filed May 20, 2016 and European Patent Application No. 16179661.0, filed Jul. 15, 2016. U.S. Provisional Patent Application No. 62/339,448 and European Patent Application No. 16179661.0 are incorporated herein.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

In commercial III-nitride LEDs, the semiconductor structure is typically grown by MOCVD. The nitrogen source used during MOCVD is typically ammonia. When ammonia dissociates, hydrogen is produced. The hydrogen forms a complex with magnesium, which is used as the p-type dopant during growth of p-type materials. The hydrogen complex deactivates the p-type character of the magnesium, effectively reducing the dopant concentration of the p-type material, which reduces the efficiency of the device. After growth of the p-type material, the structure is annealed in order to break the hydrogen-magnesium complex by driving off the hydrogen.

DETAILED DESCRIPTION

The requirement of an anneal in a hydrogen-free atmosphere to activate the p-type layers in a III-nitride device limits device design. It has been demonstrated experimentally that hydrogen cannot diffuse through n-type III-nitride materials, and the hydrogen does not readily diffuse laterally through semiconductor material over distances corresponding to half the diameter of a typical device wafer. As a result, in order for the activation anneal to be effective, the p-type layers cannot be covered by any other layer. Without an effective anneal, the device is left without a p-type layer, or with a p-type layer with an extremely low dopant concentration, rendering it useless. Accordingly, a device with a buried p-type layer, such as a device with a tunnel junction or a device where the p-type layers are grown before the n-type layers, cannot be formed by a convention process including growth by MOCVD followed by annealing.

In embodiments of the invention, a device structure is grown with a buried p-type layer. Trenches are formed in the device structure that expose portions of the buried p-type layer. The structure is then annealed, such that hydrogen can diffuse laterally out of the buried p-type layer to the trenches, where the hydrogen can escape to the ambient.

Figure 1:
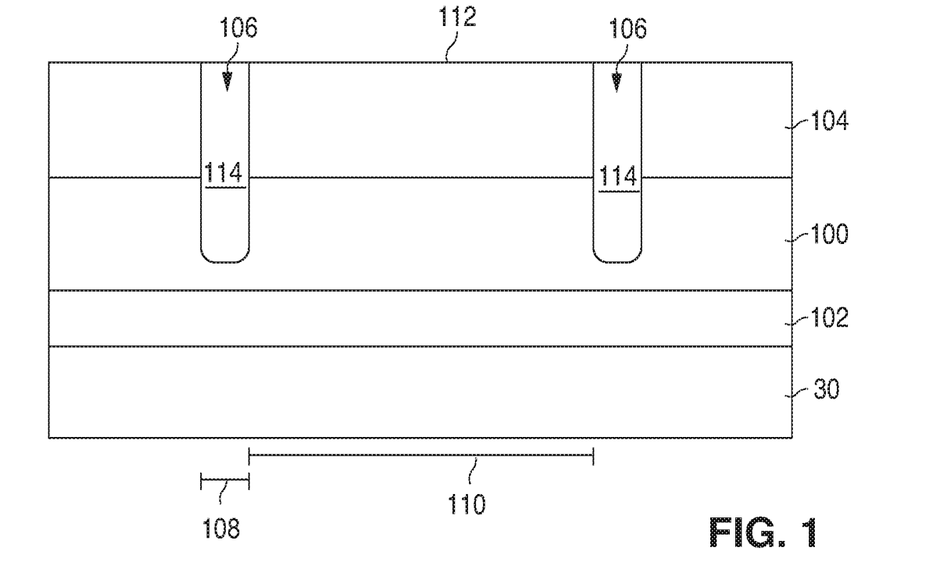
FIG. 1 illustrates a portion of a semiconductor structure including a buried p-type region and trenches for activating the p-type region.

FIG. 1 illustrates a portion of a semiconductor device structure. The structure of FIG. 1 is grown on a growth substrate 30, which may be, for example, sapphire, SiC, Si, a non-III-nitride material, GaN, a composite substrate, or any other suitable substrate. An optional III-nitride film 102 may be grown before p-type region 100, though III-nitride film 102 is not required. III-nitride film 102 may include, for example, nucleation or buffer layers, smoothing layers that may be GaN or any other III-nitride material, n-type layers, light emitting or active layers, undoped layers, the active region of a device, and/or any other suitable layers or materials.

The p-type region 100 includes at least one binary, ternary, quaternary, or quinary III-nitride layer that is doped with a p-type dopant such as, for example, Mg or any other suitable material.

A III-nitride film 104 is grown after the p-type layer 100 such that the p-type layer 100 is buried by the III-nitride film 104. III-nitride film 104 may include n-type layers, p-type layers, the active region of a device, light emitting layers, undoped layers, and/or any other suitable layers or materials.

After or during growth, trenches 106 are formed in the semiconductor structure. Trenches 106 may extend through the entire thickness of III-nitride film 104 such that the bottoms of trenches 106 are in p-type region 100, as illustrated in FIG. 1. Alternatively, trenches 106 may extend through the entire thicknesses of both III-nitride film 104 and p-type region 100 such that the bottoms of trenches 106 are in III-nitride film 102, are the surface of growth substrate 30, or extend into growth substrate 30.

The width 108 of trenches 106 may be, for example, at least 0.05 µm in some embodiments, no more than 50 µm in some embodiments, at least 0.5 µm in some embodiments, and no more than 15 µm in some embodiments. In some embodiments, the trenches are kept as small as possible to avoid losing light-emitting area.

Trenches 106 are spaced such that all of the p-type region 100 is spaced a distance from a trench that is no more than the maximum diffusion length of hydrogen during the later anneal. The maximum spacing 110 between trenches 106 may be twice the average or maximum diffusion length of hydrogen during the anneal. The spacing 110 may be determined by the conditions of the anneal, which may determine the maximum lateral diffusion length of hydrogen during the anneal—different anneals may have different maximum lateral diffusion lengths. The maximum spacing 110 between nearest neighbor trenches may be at least 1 µm in some embodiments, no more than 500 µm in some embodiments, at least 5 µm in some embodiments, and no more than 250 µm in some embodiments.

The semiconductor structure illustrated in FIG. 1 may be annealed after forming trenches 106. During the anneal, hydrogen is driven out of p-type region 100 into trenches 106, where it can escape from the semiconductor structure into the ambient.

In some embodiments, after annealing, trenches 106 may be filled with an insulating material 114. Insulating material 114 permits a metal contact to be formed on a surface with trenches, without inadvertently causing a short. Insulating material 114 may be formed at any stage of processing after the anneal—for example, trenches 106 may be filled with insulating material 114 before or after removing the growth substrate, in embodiments where the growth substrate is removed, or before or after etching to expose a buried layer, in embodiments where such etching is performed.

Figure 9:
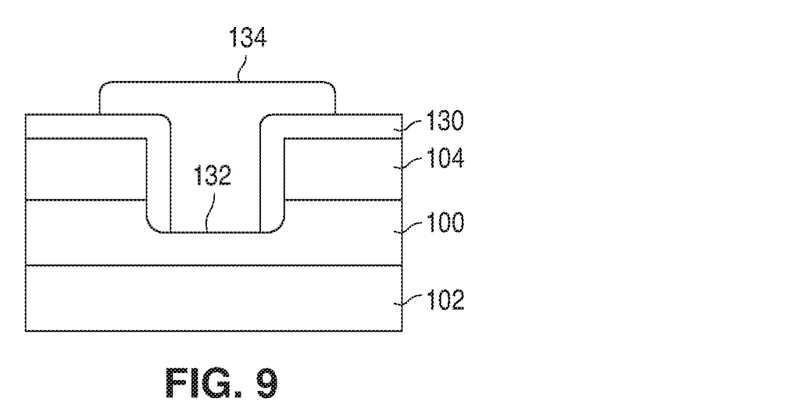
FIG. 9 illustrates a portion of a semiconductor device including a trench in which a metal contact is disposed.

In some embodiments, trenches 106 are used as vias in which metal contacts are formed, to contact the p-type region in a p-side down device, as illustrated in FIG. 9. In embodiments where metal contacts 134 are formed in trenches 106 in contact with the p-type region 100, a sequence of metals and insulators are deposited and patterned such that the metal contact is in direct contact with only the buried p-type region 100 or other desired layer (in the bottom of the trench 132 as illustrated in FIG. 9), and not the layers above (III-nitride film 104). For example, an insulating material 130 may be disposed on the sidewalls of the trench between the contact metal 134 and the semiconductor layers that are not to be in direct contact with the metal contact.

In some embodiments, trenches 106 are left exposed to air or ambient gas, or coated with a thin passivation layer ($SiO_2$ for example) rather than filled. Accordingly, in some embodiments, trenches 106 may be partially or completely filled with an insulating or passivating material.

Figure 2:
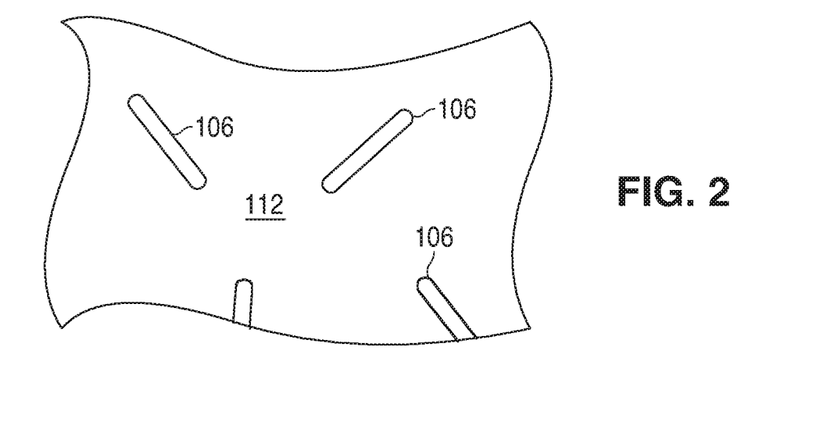
FIG. 2 illustrates a portion of the top surface of the structure illustrated in FIG. 1.

FIG. 2 is a plan view of a portion of a top surface 112 of the structure of FIG. 1. As illustrated in FIG. 2, in some embodiments, trenches 106 may be isolated from each other, and surrounded by a portion of the semiconductor structure that is uninterrupted by a trench. Accordingly, in some embodiments, the semiconductor material is all electrically connected, and no electrically isolated islands of semiconductor material are formed by trenches 106. In some embodiments, some or all trenches may connect to each other to form isolated islands of semiconductor material—for example, in some embodiments, trenches 106 may define the boundaries of a single device that is later separated from a wafer of semiconductor material. A single device formed on a wafer of devices may have some trenches that connect to each other to define the boundaries of the device or an isolated island of semiconductor material within the device, and one or more other trenches that are isolated from each other and formed within the isolated island of semiconductor material.

Figure 3:
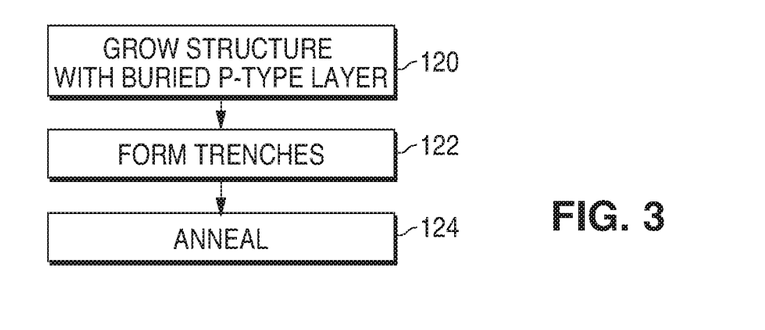
FIG. 3 is a method of forming a device with a buried p-type region, according to some embodiments of the invention.

FIG. 3 illustrates a method of forming a device. In block 120, a III-nitride structure with a buried p-type region is grown on a growth substrate.

In block 122, trenches 106 are formed in the grown III-nitride structure. Trenches 106 are illustrated in FIGS. 1 and 2. Trenches 106 may be formed by any suitable technique, including for example, dry etching, wet etching, or a combination of dry and wet etching. In some embodiments, the method of forming the trench may influence the diffusion of hydrogen out of the exposed surface of semiconductor material formed by etching the trench. For example, p-type GaN is known to convert to n-type GaN during dry etching. If the thickness of the surface of the p-type that converts to n-type is too great, the diffusion of hydrogen may be blocked such that hydrogen builds up at the type-converted surface and cannot escape. Accordingly, in some embodiments, after dry etching to form the trenches 106, the surface of the trenches may be cleaned with a wet etch to remove the n-type converted layer or to reduce the thickness of the n-type converted layer to a thickness through which hydrogen readily diffuses.

Figure 7:
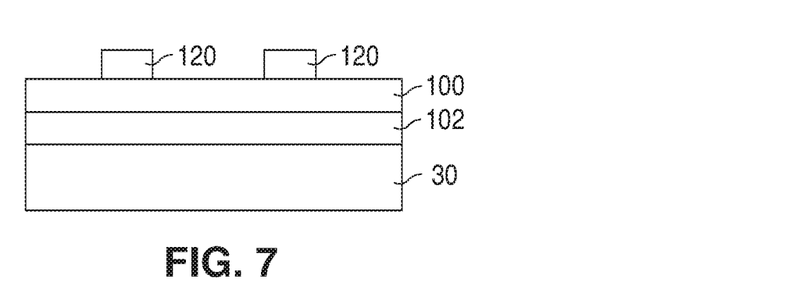
FIG. 7 illustrates a portion of a partially-grown semiconductor device, including segments of mask material.
Figure 8:
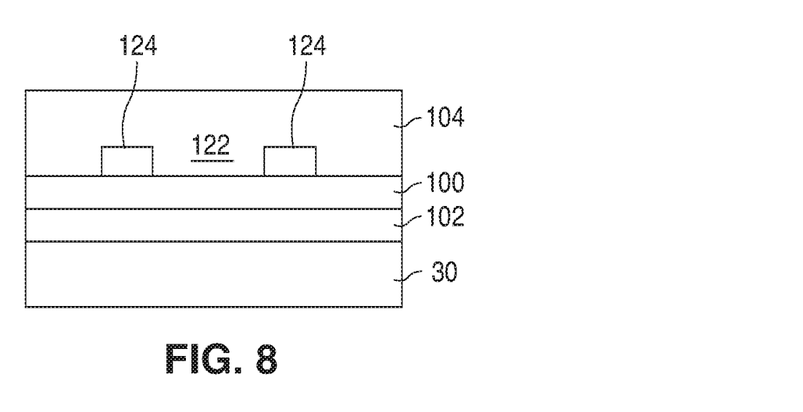
FIG. 8 illustrates a portion of a semiconductor device with embedded trenches.

In some embodiments, the semiconductor structure may be selectively grown to form trenches during growth, as illustrated in FIGS. 7 and 8. For example, as illustrated in FIG. 7, an optional III-nitride film 102 and a p-type region 100 are grown over a substrate 30. A mask material 120 such as $SiO_2$ may be disposed on the p-type region 100, then patterned such that the mask material is left in areas where trenches are formed. The mask material is not limited to the location illustrated in FIG. 7. For example, in various embodiments, the mask material is formed directly on the growth substrate, on a surface of partially grown III-nitride film 102, on the surface of a fully grown III-nitride film 102, on a surface of partially grown p-type region 100, or on the surface of fully grown p-type region 100, as illustrated. The mask material may be formed in any layer of the device, on any surface (including directly on growth substrate 30), with any thickness, and may extend through multiple layers, as long as the mask material is in direct contact with at least a portion of p-type region 100.

III-nitride film 104 is grown over the mask material 120. Growth will eventually cover the mask material via lateral overgrowth, such that areas 122 between neighboring mask regions are filled with III-nitride material, as illustrated in FIG. 8. When the die is singulated after growth, a wet etch or other suitable technique may be used to remove the mask material, creating an embedded trench 124 through which hydrogen may escape during activation anneal. During the activation anneal, hydrogen escapes from the embedded trenches through the sides of the wafer, where the embedded trenches are exposed to the ambient.

Returning to FIG. 3, in block 124, the III-nitride structure with trenches is annealed, in order to activate the buried p-type region, for example by driving off hydrogen that has formed a complex with the p-type dopant in the p-type region.

Figure 4:
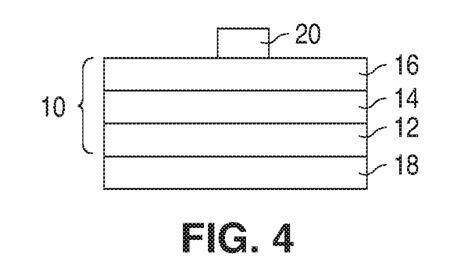
FIG. 4 illustrates an LED with a p-type region grown before the n-type region, according to some embodiments of the invention.
Figure 5:
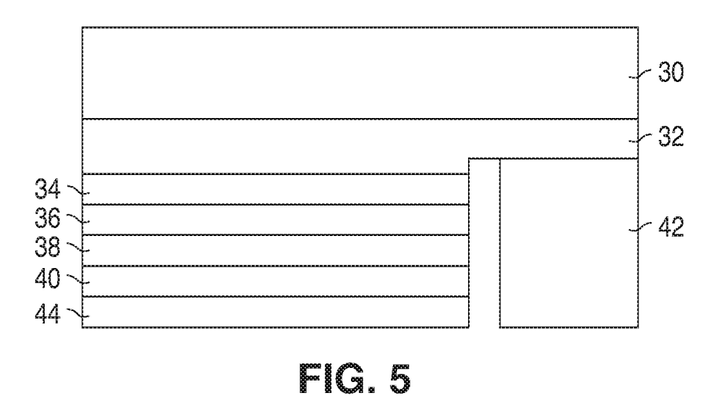
FIG. 5 illustrates an LED including a tunnel junction, according to some embodiments of the invention.
Figure 6:
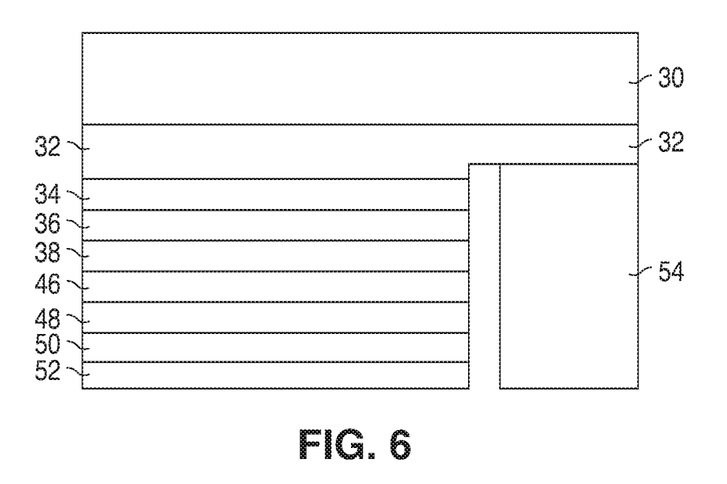
FIG. 6 illustrates a device including two LEDs separated by a tunnel junction, according to some embodiments of the invention.

FIGS. 4, 5, and 6 illustrate devices including a buried p-type region which may be activated by forming trenches and annealing, as illustrated in FIGS. 1, 2, and 3. FIG. 4 illustrates a device where the p-type region is grown before the n-type region. FIGS. 5 and 6 illustrate devices including tunnel junctions. The trenches are omitted from FIGS. 4, 5, and 6 for clarity. In particular, the devices illustrated in FIGS. 4, 5, and 6 may be, for example, on the order of 1 mm on a side, meaning that tens or even hundreds of trenches may be formed in a single device. In any of the devices illustrated in FIGS. 4, 5, and 6, one or more of the trenches may be used as vias in which metal contacts to the buried layers of the device are disposed, as described above.

In some embodiments, the p-type region of a III-nitride device is grown before the light emitting layer and the n-type region.

In conventional III-nitride LEDs, the n-type region is grown first on a substrate, followed by the light emitting layers and the p-type semiconductor. The internal field of a III-nitride LED grown n-side down increases with increasing forward bias. As a result, as the device bias (current) is increased, the internal electric field increases, reducing electron-hole overlap and thereby reducing radiative efficiency. Growing the device in the reverse order, with the p-type region grown first on the substrate, reverses the internal field. In a III-nitride LED grown p-side down, the internal field is opposite the built-in polarization field. As a result, as the forward bias (current) increases, the radiative efficiency of such a device may increase.

FIG. 4 illustrates one example of a device where the p-type region is grown before the light emitting layer and the n-type region. Such a semiconductor structure may be incorporated into any suitable device; embodiments of the invention are not limited to the vertical device illustrated. In embodiments where the original growth substrate is removed, such as, for example, a flip chip device, structure 102 may be totally removed to make electrical contact to the p-type region, or a hole/trench may be etched through structure 102 to expose a portion of the p-type region on which a metal contact may be formed. In embodiments where the substrate remains, such as, for example, a lateral die device, one contact may be disposed on the top surface of the semiconductor structure, and the other contact may be disposed on a surface exposed by etching to expose the p-type region.

The device illustrated in FIG. 4 includes a semiconductor structure 10 grown on a growth substrate (not shown). The p-type region 12 is grown first, followed by an active or light emitting region including at least one light emitting layer 14, followed by an n-type region 16.

P-type region 12 corresponds to buried p-type region 100 of FIG. 1; active region 14 and n-type region 16 correspond to III-nitride film 104 of FIG. 1; III-nitride film 102 of FIG. 1 may be a nucleation or buffer structure (not shown) or may be omitted.

A metal p-contact 18 is disposed on the p-type region 12; a metal n-contact 20 is disposed on the n-type region 16.

The semiconductor structure 10 includes a light emitting or active region sandwiched between n- and p-type regions. The n-type region 16 may include multiple layers of different compositions and dopant concentration including, for example, n- or even p-type device layers designed for particular optical, material, or electrical properties desirable for the light emitting region to efficiently emit light. The light emitting layer 14 may be included in a light emitting or active region. Examples of suitable light emitting regions include a single thick or thin light emitting layer, or a multiple quantum well light emitting region including multiple thin or thick light emitting layers separated by barrier layers. The p-type region 12 may include multiple layers of different composition, thickness, and dopant concentration, including preparation layers such as buffer layers or nucleation layers, and/or layers designed to facilitate removal of the growth substrate, which may be p-type, n-type, or not intentionally doped, and layers that are not intentionally doped, or n-type layers.

After growth, the semiconductor structure may be processed into any suitable device.

In some embodiments, a III-nitride device includes a tunnel junction. A tunnel junction (TJ) is a structure that allows electrons to tunnel from the valence band of a p-type layer to the conduction band of an n-type layer in reverse bias. When an electron tunnels, a hole is left behind in the p-type layer, such that carriers are generated in both layers. Accordingly, in an electronic device like a diode, where only a small leakage current flows in reverse bias, a large current can be carried in reverse bias across a tunnel junction. A tunnel junction requires a particular alignment of the conduction and valence bands at the p/n tunnel junction, which has typically been achieved in other materials systems using very high doping (e.g. p++/n++ junction in the (Al)GaAs material system). III-nitride materials have an inherent polarization that creates an electric field at heterointerfaces between different alloy compositions. This polarization field can be utilized to achieve the required band alignment for tunneling.

FIGS. 5 and 6 illustrate two devices including tunnel junctions.

In the device of FIG. 5, a tunnel junction is disposed between the p-type region and the metal contact that injects current into the p-type region. The contact may be formed on an n-type layer, which may have much better sheet resistance and hence better current spreading as compared to p-type layers. In the device illustrated in FIG. 5, n-type layers are used as contact layers for both the positive and negative terminals of the LED, by converting holes from the p-type region into electrons in an n-type contact layer via a tunnel junction.

The device of FIG. 5 includes an n-type region 32 grown on a growth substrate, followed by a light emitting layer 34, which may be disposed in a light emitting region, and a p-type region 36. The n-type region 32, light emitting layer 34, and p-type region 36 are described above in the text accompanying FIG. 4. A tunnel junction 38 is formed over the p-type region 36.

In some embodiments, tunnel junction 38 includes a highly doped p-type layer, also referred to as a p++ layer, in direct contact with p-type region 36, and a highly doped n-type layer, also referred to as an n++ layer, in direct contact with the p++ layer. (In some embodiments, the p++ layer of tunnel junction 38 may serve as the p-type region in the device, such that a separate p-type region is not required.) In some embodiments, tunnel junction 38 includes a layer of a composition different from the p++ layer and the n++ layer sandwiched between the p++ layer and the n++ layer. In some embodiments, tunnel junction 38 includes an InGaN layer sandwiched between the p++ layer and the n++ layer. In some embodiments, tunnel junction 38 includes an MN layer sandwiched between the p++ layer and the n++ layer. The tunnel junction 38 is in direct contact with n-type layer 40, described below.

The p++ layer may be, for example, InGaN or GaN, doped with an acceptor such as Mg or Zn to a concentration of about $10^{18}$ cm$^{-3}$ to about $5 \times 10^{20}$ cm$^{-3}$. In some embodiments, the p++ layer is doped to a concentration of about $2 \times 10^{20}$ cm$^{-3}$ to about $4 \times 10^{20}$ cm$^{-3}$. The n++ layer may be, for example, InGaN or GaN, doped with an acceptor such as Si or Ge to a concentration of about $10^{18}$ cm$^{-3}$ to about $5 \times 10^{20}$ cm$^{-3}$. In some embodiments, the n++ layer is doped to a concentration of about $7 \times 10^{19}$ cm$^{-3}$ to about $9 \times 10^{19}$ cm$^{-3}$. Tunnel junction 38 is usually very thin, for example tunnel junction 38 may have a total thickness ranging from about 2 nm to about 100 nm, and each of the p++ layer and the n++ layer may have a thickness ranging from about 1 nm to about 50 nm. In some embodiments, each of the p++ layer and the n++ layer may have a thickness ranging from about 25 nm to about 35 nm. The p++ layer and the n++ layer may not necessarily be the same thickness. In one embodiment, the p++ layer is 15 nm of Mg-doped InGaN and the n++ layer is 30 nm of Si-doped GaN. The p++ layer and the n++ layer may have a graded dopant concentration. For example, a portion of the p++ layer adjacent to the underlying p-type region 36 may have a dopant concentration that is graded from the dopant concentration of the underlying p-type region to the desired dopant concentration in the p++ layer. Similarly, the n++ layer may have a dopant concentration that is graded from a maximum adjacent to the p++ layer to a minimum adjacent to the n-type layer 40 formed over the tunnel junction 38. Tunnel junction 38 is fabricated to be thin enough and doped enough such that tunnel junction 38 displays low series voltage drop when conducting current in reverse-biased mode. In some embodiments, the voltage drop across tunnel junction 38 is about 0.1V to about 1V.

Embodiments including an InGaN or AlN or other suitable layer between the p++ layer and the n++ layer may leverage the polarization field in III-nitrides to help align the bands for tunneling. This polarization effect may reduce the doping requirement in the n++ and p++ layers and reduce the tunneling distance required (potentially allowing higher current flow). The composition of the layer between the p++ layer and the n++ layer may be different from the composition of the p++ layer and the n++ layer, and/or may be selected to cause band re-alignment due to the polarization charge that exists between dissimilar materials in the III-nitride material system.

Examples of suitable tunnel junctions are described in U.S. Pat. No. 8,039,352 B2, which is incorporated herein by reference.

An n-type contact layer 40 is formed over tunnel junction 38, in direct contact with the n++ layer.

In the device of FIG. 5, p-type region 36 and the p++ layer of tunnel junction 38 correspond to the p-type region 100 of FIG. 1; the n++ layer of tunnel junction 38 and n-type contact layer 40 correspond to III-nitride film 104 of FIG. 1; the n-type region 32 and active region 34 correspond to III-nitride film 102 of FIG. 1.

First and second metal contacts 44 and 42 are formed on the n-type contact layer 40, and on the n-type region 32, respectively. A mesa may be etched to form a flip chip device, as illustrated in FIG. 5, or any other suitable device structure may be used. The first and second metal contacts 44 and 42 may be the same material, such as aluminum, though this is not required; any suitable contact metal or metals may be used.

In the device of FIG. 6, multiple LEDs are grown on top of one another and connected in series via a tunnel junction. In the device of FIG. 6, multiple LEDs are created within the footprint of a single LED, which may dramatically increase the optical flux generated per unit area. In addition, by driving the LEDs connected by a tunnel junction at a lower drive current, each LED can operate at its peak efficiency. In a single LED, this would result in a drop in light output, however by having two or more LEDs connected in series in a given chip area, the light output can be maintained while efficiency is dramatically improved. Thus, the tunnel junction device illustrated in FIG. 6 may be used in applications that require high efficiency and/or applications that require high flux per unit area.

The device of FIG. 6 includes an n-type region 32 grown on a growth substrate, followed by a light emitting layer 34, which may be disposed in a light emitting region, and a p-type region 36 (as described above, the p++ layer of the tunnel junction may function as p-type region 36, such that a separate p-type region is not required). The n-type region 32, light emitting layer 34, and p-type region 36 are described above in the text accompanying FIG. 4. A tunnel junction 38, as described above, is formed over the p-type region 36. A second device structure, including a second n-type region 46, a second light emitting layer 48, and a second p-type region 50 are formed over tunnel junction 38. The tunnel junction 38 is oriented such that the p++ layer is in direct contact with the p-type region 36 of the first LED, and the n++ layer is in direct contact with the n-type region 46 of the second LED.

In the device of FIG. 6, p-type region 36 and the p++ layer of tunnel junction 38 correspond to the p-type region 100 of FIG. 1; the n++ layer of tunnel junction 38, n-type layer 46, active region 48, and p-type region 50 correspond to III-nitride film 104 of FIG. 1 (if the trenches are in direct contact with p-type region 50, the trenches will also activate p-type region 50, though p-type region 50, if it is the last grown layer, may also be activated by a conventional anneal); the n-type region 32 and active region 34 correspond to III-nitride film 102 of FIG. 1.

First and second metal contacts 54 and 52 are formed on the n-type region 32 of the first LED, and on the p-type region 50 of the second LED, respectively. A mesa may be etched to form a flip chip device, as illustrated in FIG. 6, or any other suitable device structure may be used. In some embodiments, an additional tunnel junction and n-type layer may be formed over the p-type region 50 of the second LED, in order to form the second metal contact 52 on an n-type layer, as illustrated in the device of FIG. 5.

Though two active regions are illustrated in FIG. 6, any number of active regions may be included between the two metal contacts illustrated, provided the p-type region adjacent each active region is separated from the n-type region adjacent the next active region by a tunnel junction. Since the device of FIG. 6 has only two contacts, both light emitting layers emit light at the same time and cannot be individually and separately activated. In other embodiments, individual LEDs in the stack may be separately activated by forming additional contacts. In some embodiments, a device may have enough junctions such that the device can operate at a typical line voltage such as, for example, 110 volts, 220 volts, etc.

The two light emitting layers may be fabricated with the same composition, such that they emit the same color light, or with different compositions, such that they emit different colors (i.e. different peak wavelengths) of light. For example, a three active region device with two contacts may be fabricated such that the first active region emits red light, the second active region emits blue light, and the third active region emits green light. When activated, the device may produce white light. Since the active regions are stacked such that they appear to emit light from the same area, such devices may avoid problems with color mixing present in a device that combines red, blue, and green light from adjacent, rather than stacked, active regions. In a device with active regions emitting different wavelengths of light, the active region that generates light of the shortest wavelength may be located closest to the surface from which light is extracted, generally the sapphire, SiC, or GaN growth substrate in an LED. Placement of the shortest wavelength active region near the output surface may minimize loss due to absorption in the quantum wells of the other active regions and may reduce the thermal impact on more sensitive longer wavelength quantum wells by locating the longer wavelength active regions closer to the heat sink formed by the contacts. The quantum well layers may also be made sufficiently thin that absorption of light in the quantum well layers is low. The color of the mixed light emitted from the device may be controlled by selecting the number of active regions that emit light of each color. For example, the human eye is very sensitive to green photons and not as sensitive to red photons and blue photons. In order to create balanced white light, a stacked active region device may have a single green active region and multiple blue and red active regions.

The devices of FIGS. 4, 5, and 6 are formed by growing a III-nitride semiconductor structure on a growth substrate 30 as is known in the art. The growth substrate is often sapphire but may be any suitable substrate such as, for example, SiC, Si, GaN, or a composite substrate (such as, for example, GaN on a sapphire template). A surface of the growth substrate on which the III-nitride semiconductor structure is grown may be patterned, roughened, or textured before growth, which may improve light extraction from the device. A surface of the growth substrate opposite the growth surface (i.e. the surface through which a majority of light is extracted in a flip chip configuration) may be patterned, roughened or textured before or after growth, which may improve light extraction from the device.

The metal contacts often include multiple conductive layers such as a reflective metal and a guard metal which may prevent or reduce electromigration of the reflective metal. The reflective metal is often silver but any suitable material or materials may be used. The metal contacts are electrically isolated from each other by a gap which may be filled with a dielectric such as an oxide of silicon or any other suitable material. Multiple vias to expose portions of n-type region 32 may be formed; the metal contacts are not limited to the arrangements illustrated in FIGS. 4, 5, and 6. The metal contacts may be redistributed to form bond pads with a dielectric/metal stack, as is known in the art.

In order to form electrical connections to the LED, one or more interconnects are formed on or electrically connected to the two metal contacts illustrated. The interconnects may be, for example, solder, stud bumps, gold layers, or any other suitable structure.

The substrate 30 may be thinned or entirely removed. In some embodiments, the surface of substrate 30 exposed by thinning is patterned, textured, or roughened to improve light extraction.

Any of the devices described herein may be combined with a wavelength converting structure. The wavelength converting structure may contain one or more wavelength converting materials. The wavelength converting structure may be directly connected to the LED, disposed in close proximity to the LED but not directly connected to the LED, or spaced apart from the LED. The wavelength converting structure may be any suitable structure. The wavelength converting structure may be formed separately from the LED, or formed in situ with the LED.

Examples of wavelength converting structures that are formed separately from the LED include ceramic wavelength converting structures, that may be formed by sintering or any other suitable process; wavelength converting materials such as powder phosphors that are disposed in transparent material such as silicone or glass that is rolled, cast, or otherwise formed into a sheet, then singulated into individual wavelength converting structures; and wavelength converting materials such as powder phosphors that are disposed in a transparent material such as silicone that is formed into a flexible sheet, which may be laminated or otherwise disposed over an LED.

Examples of wavelength converting structures that are formed in situ include wavelength converting materials such as powder phosphors that are mixed with a transparent material such as silicone and dispensed, screen printed, stenciled, molded, or otherwise disposed over the LED; and wavelength converting materials that are coated on the LED by electrophoretic, vapor, or any other suitable type of deposition.

Multiple forms of wavelength converting structure can be used in a single device. As just one example, a ceramic wavelength converting member can be combined with a molded wavelength converting member, with the same or different wavelength converting materials in the ceramic and the molded members.

The wavelength converting structure may include, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce.

The wavelength converting material absorbs light emitted by the LED and emits light of one or more different wavelengths. Unconverted light emitted by the LED is often part of the final spectrum of light extracted from the structure, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting materials, and a UV-emitting LED combined with blue-, green-, and red-emitting wavelength converting materials. Wavelength converting materials emitting other colors of light may be added to tailor the spectrum of light extracted from the structure.

The embodiments described herein may be incorporated into any suitable light emitting device. Embodiments of the invention are not limited to the particular structures illustrated.

Some features of some embodiments may be omitted or implemented with other embodiments. The device elements and method elements described herein may be interchangeable and used in or omitted from any of the examples or embodiments described herein.

Though in the examples and embodiments described above the semiconductor light emitting device is a III-nitride LED that emits blue or UV light, semiconductor light emitting devices besides LEDs, such as laser diodes, are within the scope of the invention. In addition, the principles described herein may be applicable to semiconductor light emitting or other devices made from other materials systems such as other III-V materials, III-phosphide, III-arsenide, II-VI materials, ZnO, or Si-based materials.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A method comprising:
  growing a semiconductor structure comprising at least one III-nitride light emitting layer, at least one p-type region and at least one n-type region, the at least one p-type region being buried below the at least one n-type region within the semiconductor structure, selectively growing the semiconductor structure to form a trench that exposes a portion of the at least one p-type region; and
  after forming the trench, annealing the semiconductor structure, wherein selectively growing the semiconductor structure comprises:
    forming a plurality of sections of mask material on a surface of the at least one p-type region;
    growing the semiconductor structure around the plurality of sections of mask material; and
    after said growing the semiconductor structure around the plurality of sections of mask material, removing the plurality of sections of mask material.

2. The method of claim 1, further comprising, after said annealing the semiconductor structure, filling the trench with an insulating material.

3. The method of claim 2, further comprising filling the trench with an insulating material such that the insulating material is in contact with the at least one n-type region and the at least one p-type region.

4. The method of claim 1, further comprising:
  disposing a metal in the trench, wherein the metal is in direct contact with a first portion of the semiconductor structure in the trench, and an insulating layer is disposed between the metal and a second portion of the semiconductor structure in the trench.

5. The method of claim 1, further comprising forming a plurality of trenches.

6. The method of claim 5, wherein each trench is completely surrounded by at least a portion of the semiconductor structure that is uninterrupted by the trench.

7. The method of claim 5, wherein nearest neighbor trenches are spaced less than twice a maximum length of diffusion of hydrogen during said annealing the semiconductor structure.

8. The method of claim 1, wherein the semiconductor structure comprises a tunnel junction.

9. The method of claim 1, wherein the at least one p-type region is buried below the at least one n-type region such that the entire at least one p-type region is buried below the at least one n-type region.

10. The method of claim 1, wherein the trench extends through the semiconductor structure.

11. The method of claim 1, wherein removing the plurality of sections of mask material comprises completely removing the plurality of sections of mask material.

12. A method of forming a device, the method comprising:
  growing a p-type layer;
  forming a mask layer in contact with at least one portion of the p-type layer, the mask layer enabling removal of hydrogen from the p-type layer;
  growing a n-type layer on the mask layer and the p-type layer;
  annealing the device; and
  forming at least one embedded trench by removing the mask layer, the at least one embedded trench exposing the at least one portion of the p-type layer to an ambient environment.

13. The method of claim 12, wherein the at least one embedded trench is a lateral embedded trench.

14. The method of claim 12, wherein the at least one embedded trench is a vertical embedded trench.

15. The method of claim 12, wherein the at least one embedded trench is a combination of lateral embedded trenches and vertical embedded trenches.

16. The method of claim 12, wherein the mask layer is a plurality of mask regions, each mask region being in contact with a portion of the p-type layer.

17. The method of claim 12, further comprising:
  filling the at least one trench with an insulating material.

18. The method of claim 12, wherein the at least one embedded trench is surrounded by portions of at least one of the p-type layer or n-type layer that are uninterrupted by the at least one embedded trench.

19. The method of claim 12, wherein nearest neighbor trenches are spaced less than twice a maximum length of diffusion of hydrogen during an annealing process.

20. The method of claim 12, further comprising:
  growing tunnel junctions on the p-type layer.

21. A method comprising:
  growing a semiconductor structure comprising at least one III-nitride light emitting layer, at least one p-type region and at least one n-type region, the at least one p-type region being buried below the at least one n-type region within the semiconductor structure, selectively growing the semiconductor structure to form a plurality of trenches that expose a portion of the at least one p-type region, such that at least one trench extends through the at least one n-type region and terminates at a bottom comprising the at least one p-type region; and
  after forming the plurality of trenches, annealing the semiconductor structure, wherein each trench is completely surrounded by at least a portion of the semiconductor structure that is uninterrupted by the trench.

22. A method comprising:
  growing a semiconductor structure comprising at least one III-nitride light emitting layer, at least one p-type region and at least one n-type region, the at least one p-type region being buried below the at least one n-type region within the semiconductor structure, selectively growing the semiconductor structure to form a plurality of trenches that expose a portion of the at least one p-type region, such that at least one trench extends through the at least one n-type region and terminates at a bottom comprising the at least one p-type region; and
  after forming the plurality of trenches, annealing the semiconductor structure, wherein nearest neighbor trenches are spaced less than twice a maximum length of diffusion of hydrogen during said annealing the semiconductor structure.

* * * * *